(12) United States Patent
Tsui et al.

(10) Patent No.: US 7,358,559 B2
(45) Date of Patent: Apr. 15, 2008

(54) BI-DIRECTIONAL READ/PROGRAM NON-VOLATILE FLOATING GATE MEMORY ARRAY, AND METHOD OF FORMATION

(75) Inventors: Felix (Ying-Kit) Tsui, Cupertino, CA (US); Jeng-Wei Yang, Jhubei (TW); Bomy Chen, Cupertino, CA (US); Chun-Ming Chen, Banciao (TW); Dana Lee, Santa Clara, CA (US); Changyuan Chen, Sunnyvale, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 125 days.

(21) Appl. No.: 11/239,791

(22) Filed: Sep. 29, 2005

(65) Prior Publication Data

US 2007/0069275 A1    Mar. 29, 2007

(51) Int. Cl.
*H01L 29/788* (2006.01)
(52) U.S. Cl. .................. 257/315; 257/314; 257/316; 257/324; 438/259; 438/261; 438/266
(58) Field of Classification Search ................ 257/315
See application file for complete search history.

(56) References Cited

U.S. PATENT DOCUMENTS

| | | | |
|---|---|---|---|
| 5,029,130 A | 7/1991 | Yeh | |
| 6,011,725 A | 1/2000 | Eitan | |
| 6,936,883 B2 * | 8/2005 | Chen et al. | 257/315 |
| 7,151,021 B2 * | 12/2006 | Chen et al. | 438/201 |
| 2004/0195615 A1 | 10/2004 | Chen | |

* cited by examiner

*Primary Examiner*—Jerome Jackson
*Assistant Examiner*—José R Diaz
(74) *Attorney, Agent, or Firm*—DLA Piper US LLP

(57) ABSTRACT

A bi-directional read/program non-volatile memory cell and array is capable of achieving high density. Each memory cell has two spaced floating gates for storage of charges thereon. The cell has spaced apart source/drain regions with a channel therebetween, with the channel having three portions. One of the floating gate is over a first portion; another floating gate is over a second portion, and a gate electrode controls the conduction of the channel in the third portion between the first and second portions. A control gate is connected to each of the source/drain regions, and is also capacitively coupled to the floating gate. The cell programs by hot channel electron injection, and erases by Fowler-Nordheim tunneling of electrons from the floating gate to the gate electrode. Bi-directional read permits the cell to be programmed to store bits, with one bit in each floating gate. An array of such memory cells comprises rows of cells in active regions adjacent to one another separated from one another by the semiconductive substrate material without any isolation material. Cells in the same column have the source/drain region in common, the drain/source region in common and a first and second control gates in each of the trenches in common. Cells in adjacent columns have the source/drain in common and the first control gate in common.

13 Claims, 10 Drawing Sheets

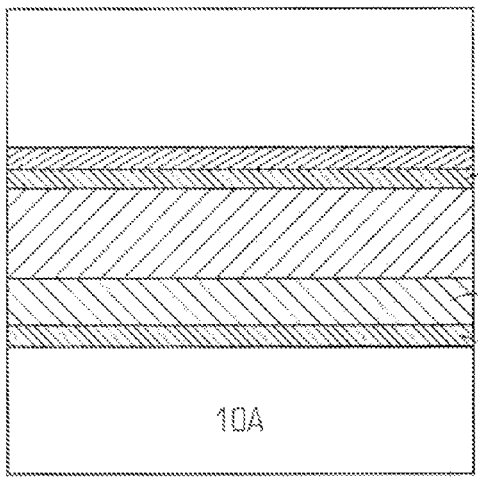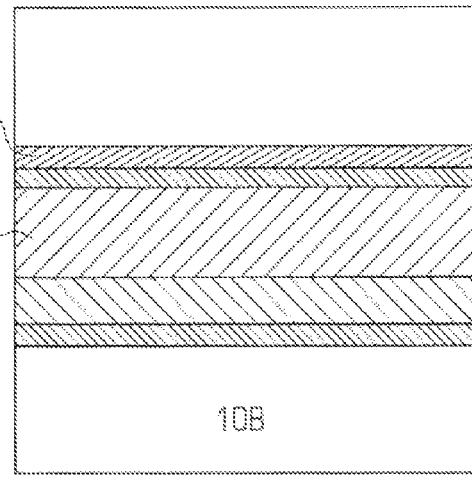
FIG. 1-A1  FIG. 1-B1
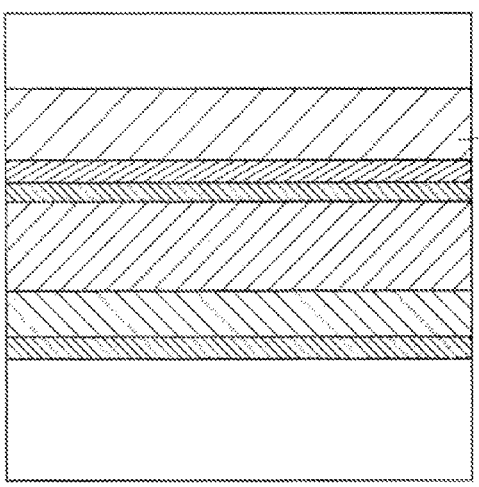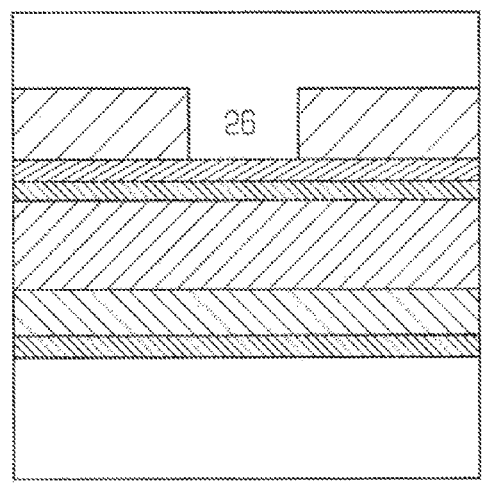
FIG. 1-A2  FIG. 1-B2
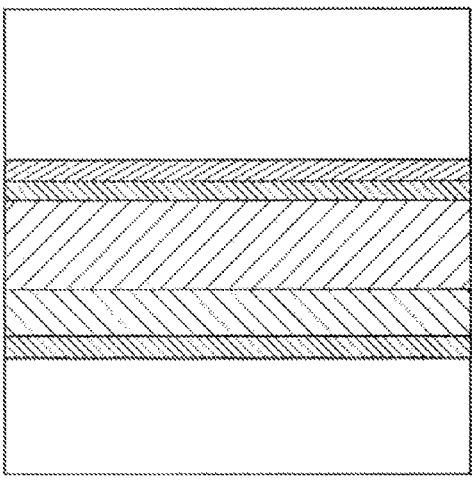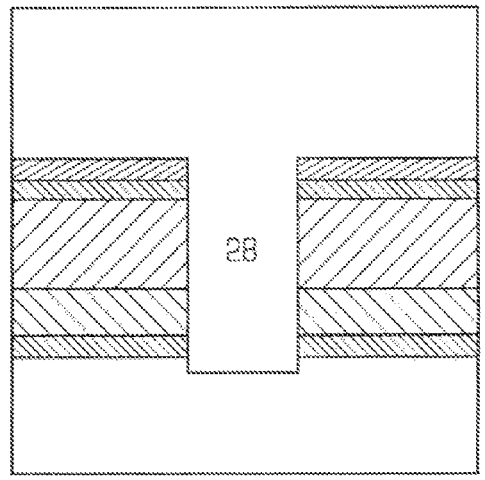
FIG. 1-A3  FIG. 1-B3

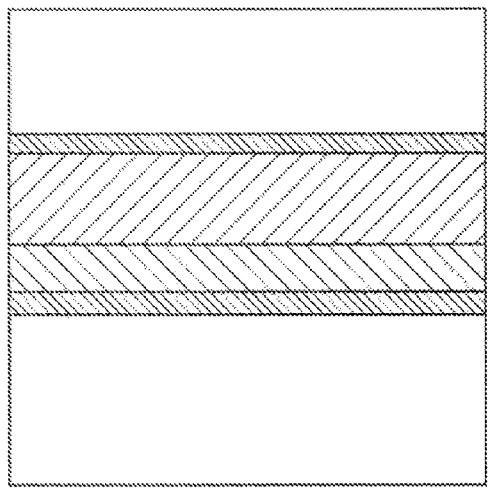
FIG. 1-A4
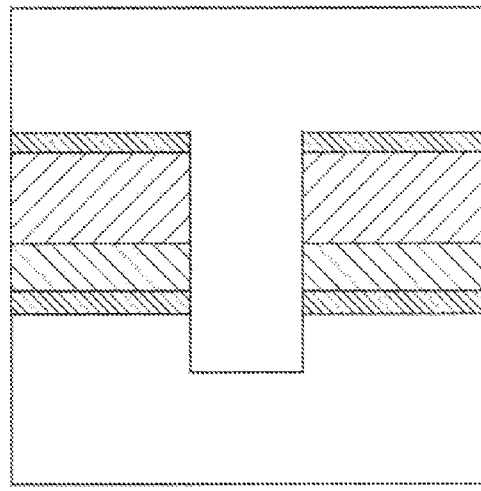
FIG. 1-B4
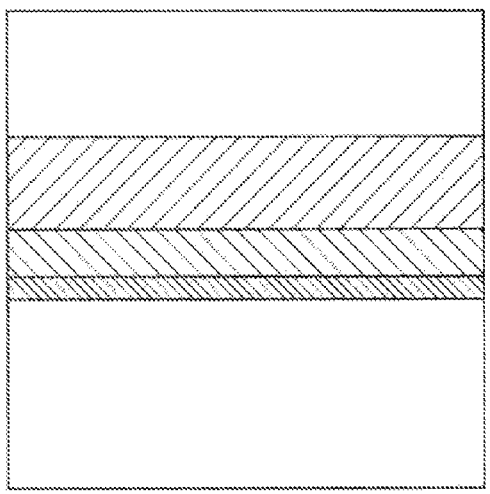
FIG. 1-A5
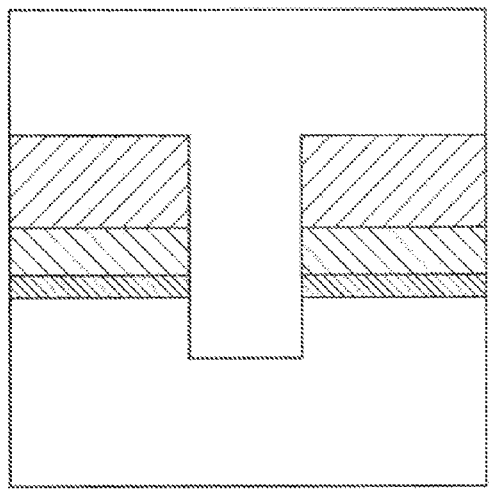
FIG. 1-B5
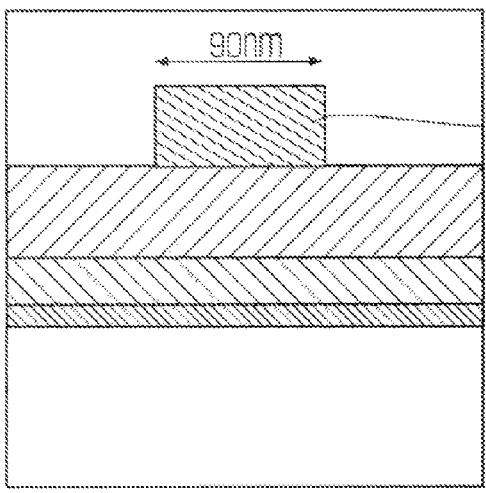
FIG. 1-A6
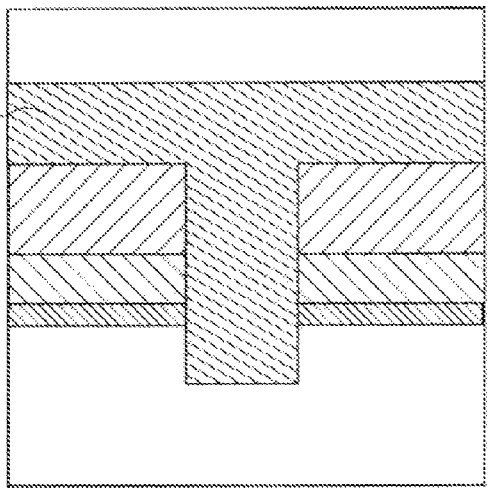
FIG. 1-B6

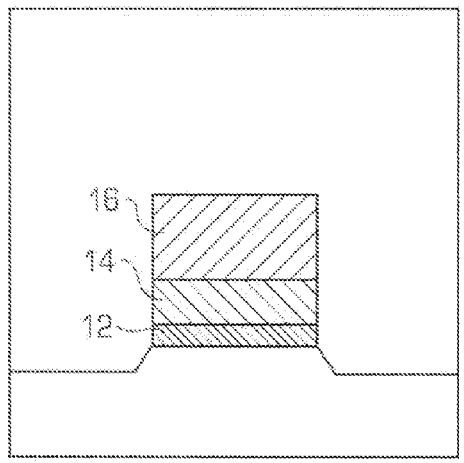
FIG. 1-A7
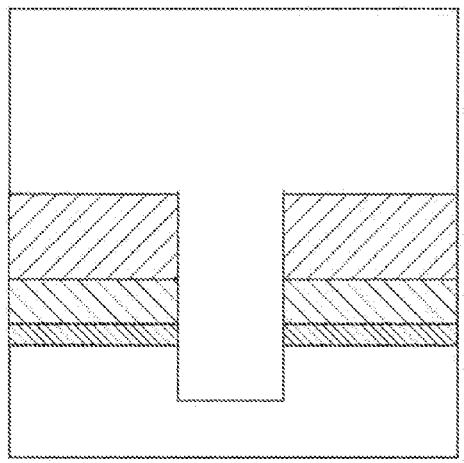
FIG. 1-B7
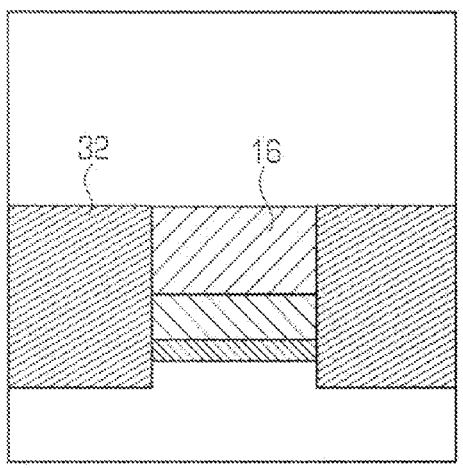
FIG. 1-A8
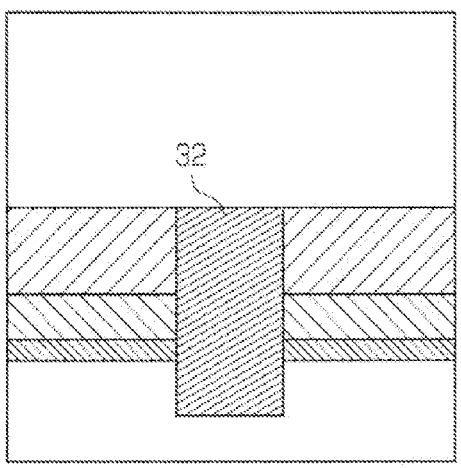
FIG. 1-B8
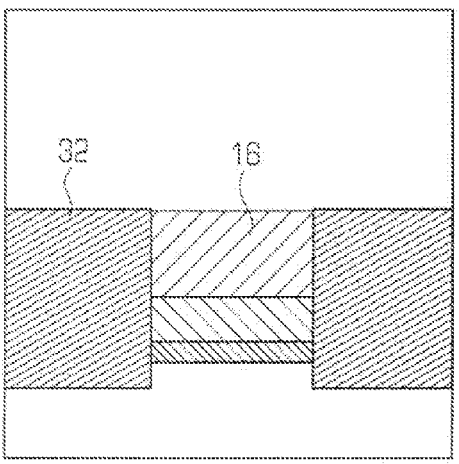
FIG. 1-A9
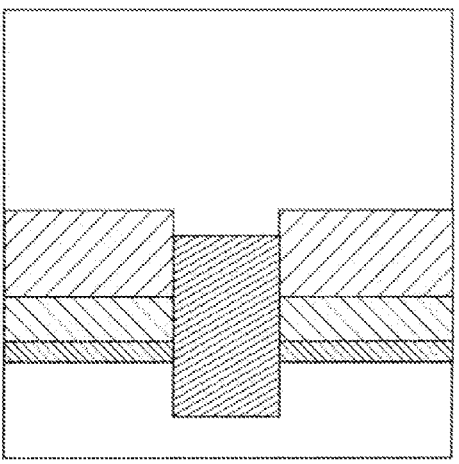
FIG. 1-B9

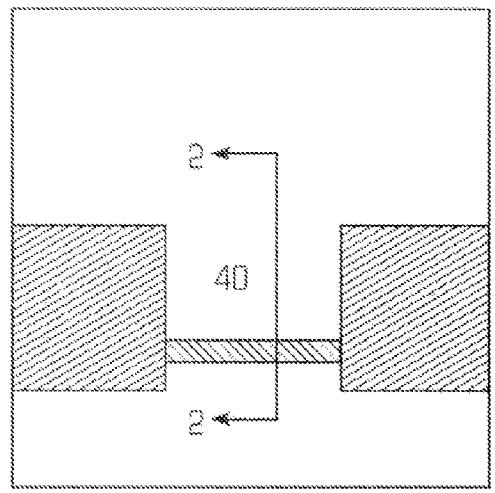
FIG. 1-A10
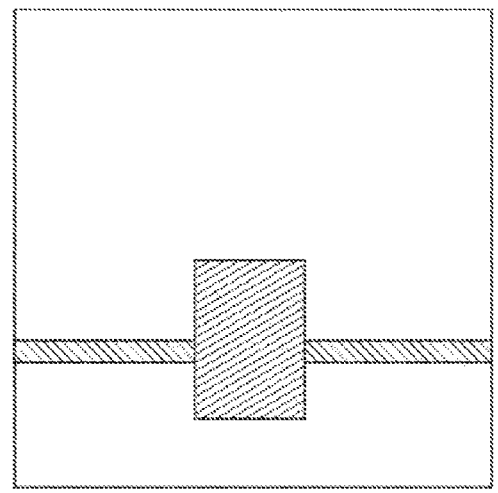
FIG. 1-B10
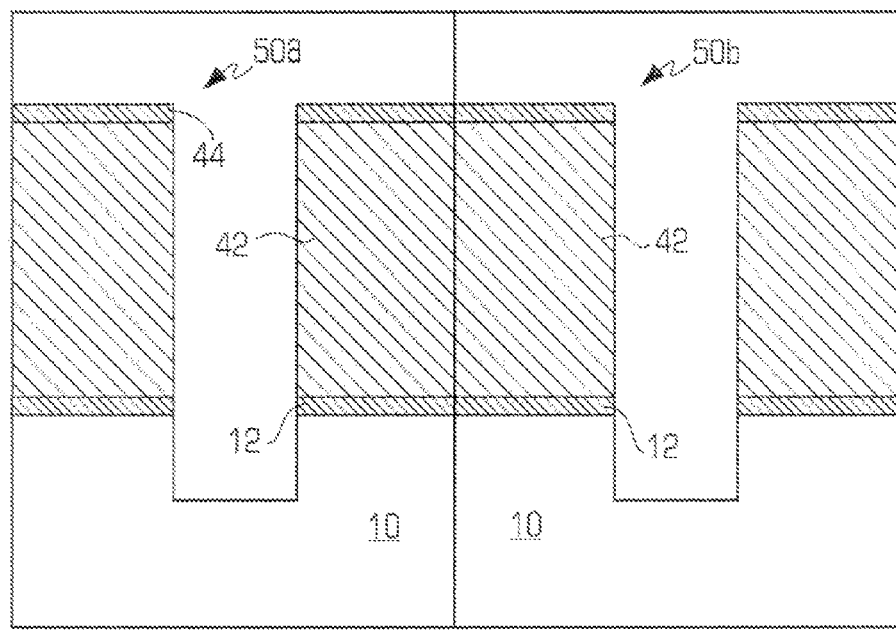
FIG. 2A

BI-DIRECTIONAL READ/PROGRAM NON-VOLATILE FLOATING GATE MEMORY ARRAY, AND METHOD OF FORMATION

TECHNICAL FIELD

The present invention relates to a bi-directional read/program non-volatile memory cell, that uses a floating gate for storage of charges capable of storing a plurality of bits in a single cell. More particularly, the present invention relates to an array of such non-volatile memory cell with no isolation regions between active regions, and a method of manufacturing.

BACKGROUND OF THE INVENTION

Uni-directional read/program non-volatile memory cells using floating gate for storage are well known in the art. See for example, U.S. Pat. No. 5,029,130, assigned to the present assignee. Typically, each of these types of memory cells uses a conductive floating gate to store one bit, i.e. either the floating gate stores charges or it does not. The charges stored on a floating gate control the conduction of charges in a channel of a transistor. In a desire to increase the storage capacity of such non-volatile memory cells, the floating gate of such memory cell is programmed to store some charges, with the different amount of charges stored being determinative of the different states of the cell, thereby causing a plurality of bits to be stored in a single cell. The problem with programming a cell to one of a multilevel state and then reading such a state is that the amount of charge stored on the floating gate differentiating one state from another must be very carefully controlled.

Bi-directional read/program non-volatile memory cells capable of storing a plurality of bits in a single cell are also well known in the art. See, for example, U.S. Pat. No. 6,011,725. Typically, these types of memory cells use an insulating trapping material, such as silicon nitride, which is between two other insulation layers, such as silicon dioxide, to trap charges. The charges are trapped near the source/drain also to control the conduction of charges in a channel of a transistor. The cell is read in one direction to determine the state of charges trapped near one of the source/drain regions, and is read in the opposite direction to determine the state of charges trapped near the other source/drain region. Hence, these cells are read and programmed bi-directionally. The problem with these types of cells is that to erase, holes or charges of the opposite conductivity must also be "programmed" or injected into the trapping material at precisely the same location where the programming charges were initially trapped in order to "neutralize" the programming charges. Since the programming charges and the erase charges are injected into a non-conductive trapping material, the charges do not move as in a conductive material. Therefore, if there is any error in injecting the erase charges to the location of the programming charges, the erase charges will not neutralize the programming charges, and the cell will not be completely erased. Moreover, to inject the erase charges, the cell must be erased bi-directionally, thereby increasing the time required for erasure of one cell.

The present invention is an improvement to the invention disclosed in U.S. patent application Ser. No. 10/409,333 published on Oct. 7, 2004, whose disclosure is incorporated herein by reference in its entirety. Although the present invention is an improvement to the aforementioned reference, the aforementioned reference is not prior art to the present invention since the present application is assigned to the same assignee as that reference.

SUMMARY OF THE INVENTION

In the present invention, an array of non-volatile memory cells is arranged in a plurality of rows and columns. The array comprises a substantially single crystalline semiconductive substrate material of a first conductivity type. A plurality of non-volatile memory cells are arranged in a plurality of rows and columns in the semiconductive substrate material with each cell for storing a plurality of bits. Each cell comprises a first region of a second conductivity type, different from the first conductivity type in the material, and a second region of the second conductivity type in the material, spaced apart from the first region. A channel region has a first portion, a second portion and a third portion and connects the first and second regions for the conduction of charges. A dielectric is on the channel region. A first floating gate is on the dielectric, spaced apart from the first portion of the channel region. The first portion of the channel region is adjacent to the first region. The first floating gate is for the storage of at least one of the plurality of bits. A second floating gate is on the dielectric, spaced apart from the second portion of the channel region. The second portion of the channel region is adjacent to the second region. The second floating gate is for the storage of at least another of the plurality of bits. A gate electrode is on the dielectric, spaced apart from the third portion of the channel region. The third portion of the channel region is between the first portion and the second portion. A first gate electrode is electrically connected to the first region and is capacitively coupled to the first floating gate. A second gate electrode is electrically connected to the second region and is capacitively coupled to the second floating gate. Cells in the same row have the gate electrode in common. Further cells in adjacent rows are separated from one another by the semiconductive substrate material without any isolation material. Cells in the same column have the first region in common, the second region in common, the first gate electrode in common, and the second gate electrode in common. Finally, cells in adjacent columns have the first region in common and the first gate electrode in common.

The present invention also relates to a method of making the non-volatile memory array.

BRIEF DESCRIPTION OF THE DRAWINGS

FIGS. 1-A(1-10) and 1-B(1-10) are cross sectional views of the steps to process a semiconductor substrate before the steps showing the method of the present invention.

FIGS. 1-A(1-10) are cross-sectional views shows the processing steps in the memory array portion, whereas FIGS. 1-B(1-10) are cross-sectional views showing the corresponding processing steps in the periphery portion showing the formation of shallow trench isolation in the peripheral region.

FIGS. 2A-2K are cross sectional views of the semiconductor structure in FIG. 1-A10 taken along the line 2-2 showing in sequence the steps in the processing of the semiconductor structure in the formation of a non-volatile memory array of floating gate memory cells of the present invention.

DETAILED DESCRIPTION OF THE INVENTION

Figure 2B:
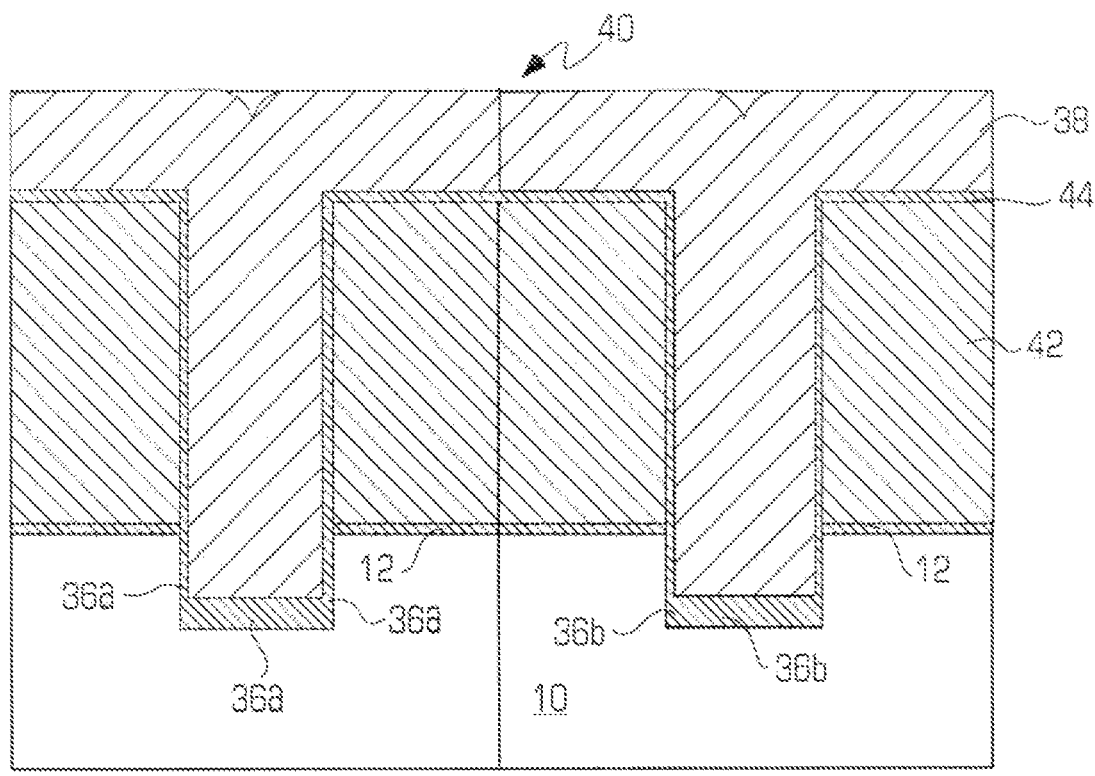

The present invention relates to an array of non-volatile memory cells, without any isolation between rows of adjacent active regions, and a method of making thereof, which is illustrated in FIGS. 2A to 2K. However, as is well known in the art, an array of non-volatile memory cells is typically integrated with peripheral circuits on an integrated circuit. Further, typically, isolation regions must be formed in the peripheral circuit portion of an integrated circuit memory device. Thus, before discussing the method of manufacturing the array of the present invention, a discussion will be made as to the methods for the formation of the isolation regions in the peripheral circuits.

The method begins with a semiconductor substrate 10, which is preferably of P type and is well known in the art. The thickness of the layers described below will depend upon the design rules and the process technology generation. What is described herein is for the 90 nm process. However, it will be understood by those skilled in the art that the present invention is not limited to any specific process technology generation, nor to any specific value in any of the process parameters described hereinafter.

Isolation Region Formation in the Peripheral Region

FIGS. 1-B1 to 1-B10 illustrate the processing of a substrate 10 in the formation of the isolation regions in the peripheral region 10B while FIGS. 1-A1 to 1-A10 illustrate the corresponding processing steps in the memory array portion Referring to FIGS. 1-A1 and 1-B1, there is shown a cross sectional view of a semiconductor substrate 10 (or a semiconductor well), which is preferably of P type and is well known in the art. A first layer 12 of silicon dioxide (hereinafter "oxide") of approximately 110 Å is deposited or grown on the substrate 10. Thereafter a layer 14 of polysilicon 14 (hereinafter "poly") of approximately 200 Å is grown or deposited on the oxide 12. A layer 16 of silicon nitride (hereinafter "nitride") of approximately 1400 Å is grown or deposited on the layer 14. Another layer 18 of oxide of approximately 300 Å is deposited. The layer 18 can be TEOS deposited oxide. Finally, a layer 20 of Silicon Oxynitride (SiON) of approximately 480 Å is deposited on the layer 18. The resultant structure is shown in FIGS. 1-A1 and 1-B1.

Photoresist 22 is then applied to cover the structure shown in FIGS. 1-A1 and 1-B1. The memory array portion 10A is covered and an opening 26 of approximately 90 nm (or any other desired lithographic size) is made in the peripheral portion 10B. The resultant structure is shown in FIGS. 1-A2 and 1-B2.

Through the opening 26, the layer 20 of SiOn is etched, the layer 18 of oxide is etched, the layer 16 of nitride is etched, the layer 14 of polysilicon is etched, the layer 12 of oxide is etched, and the substrate 10 is etched to formed a trench 28 of approximately 2000-3000 Å deep. The photoresist 22 is then removed. The layer 20 of SiON is also removed. The resultant structure is shown in FIGS. 1-A4 and 1-B4.

The layer 18 of TEOS oxide is removed by dipping the structure in DHF. The resultant structure is shown in FIGS. 1-A5 and 1-B5.

Photoresist 30 is then applied again to the entire structure. A masking step is performed in the memory array portion 10A, creating openings in the photoresist 30. The resultant structure is shown in FIGS. 1-A6 and 1-B6.

Using the openings in the memory array portion 10A, the layer 16 of nitride is etched, the layer 14 of polysilicon is etched, and the layer of oxide 12 is etched. Further, the silicon substrate 10 may be optionally etched. The photoresist 30 is then removed, resulting in the structure shown in FIGS. 1-A7 and 1-B7.

Sacrificial oxide is then deposited. This is followed by a dilute HF acid dip. Then a High Density Plasma Chemical Vapor Deposition step of oxide 32 is performed. Finally a two step CMP step with high selectivity of oxide 32 and nitride 16 is performed. The resultant structure is shown in FIGS. 1-A8 and 1-B8.

The memory array portion 10A is covered again, and the STI 32 in the peripheral portion is reduced by selective etching. The resultant structure is shown in FIGS. 1-A9 and 1-B9.

The structure shown in FIGS. 1-A9 and 1-B9 is subject to a process to remove the SiN 16 and the polysilicon 14. This results in trenches 40 being formed in the memory array portion 10A. The resultant structure is shown in FIGS. 1-A10 and 1-B10.

Memory Cell/Array Formation

The structure shown in FIG. 1-A10 is further processed as follows. FIGS. 2A to 2K show the cross sections of the structure in the active regions 40 from a view orthogonal to that of FIG. 1-A10 (along line 2-2 as shown in FIG. 1-A10).

The active region 40 portion of the substrate 10 can be doped at this time for better independent control of the cell array portion of the memory device relative to the periphery region. Such doping is often referred to as a $V_t$ implant or cell well implant, and is well known in the art. During this implant, the periphery region is protected by a photo resist layer, which is deposited over the entire structure and removed from just the memory cell array region of the substrate.

Next, a thick layer (e.g. ~1650 Å thick) of hard mask material 42 such as silicon nitride is formed over oxide layer 12. This is followed by deposition of another layer of oxide 44 of approximately 800 Å thick. A plurality of parallel second trenches 50 are formed in the oxide layer 44, the nitride layer 42 and the oxide layer 12, by applying a photo resist (masking) material on the oxide layer 44, and then performing a masking step to remove the photo resist material from selected parallel stripe regions. An anisotropic oxide etch is used to remove the oxide layer 44, then an anisotropic nitride etch is used to remove the exposed portions of nitride layer 42 in the stripe regions, leaving second trenches 50 that extend down to and expose oxide layer 12. After the photo resist is removed, an anisotropic oxide etch is used to remove the exposed portions of oxide layer 12 and extend second trenches 50 down to the substrate 10. A silicon anisotropic etch process is then used to extend second trenches 50 down into the substrate 10 in each of the active regions 40 (for example, down to a depth of approximately one feature size deep, e.g. about 0.15 um deep with 0.15 um technology). Alternately, the photo resist can be removed after trenches 50 are formed into the substrate 10. The resulting active region 40 is shown in FIG. 2A.

A layer of insulation material 36 is next formed (preferably using a thermal oxidation process) along the exposed silicon in second trenches 50 that forms the bottom and lower sidewalls of the second trenches 50 (e.g. ~70 Å to 120 Å thick). A thick layer of polysilicon 38 is then formed over the structure, which fills second trenches 50. Poly layer 38 can be doped (e.g. n+) by ion implant, or by an in-situ process. The resulting active region 40 is shown in FIG. 2B.

Figure 2C:
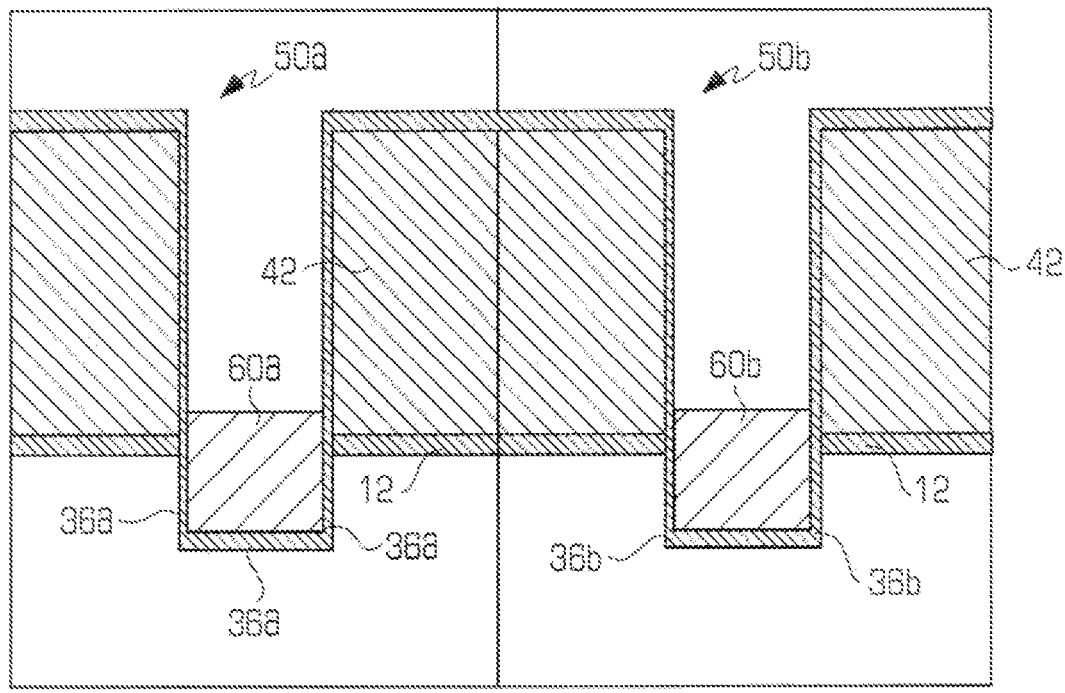

A poly etch process (e.g. a CMP process using oxide layer 44 as an etch stop) is used to remove poly layer 38 except for blocks 60 of the polysilicon 38 left remaining in second trenches 50. A controlled poly etch is then used to lower the height of poly blocks 60, where the tops of poly blocks 60 are disposed above the surface of the substrate, but below the tops of STI blocks 32 in the adjacent rows. The resultant structure is shown in FIG. 2C.

Figure 2D:
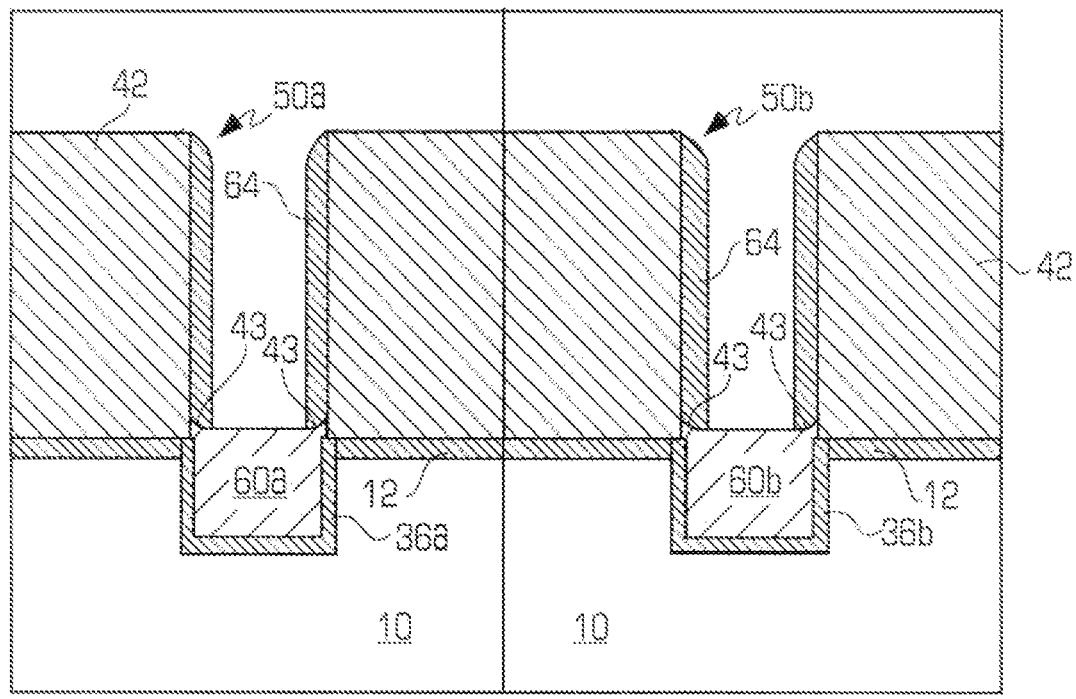
Figure 2E:
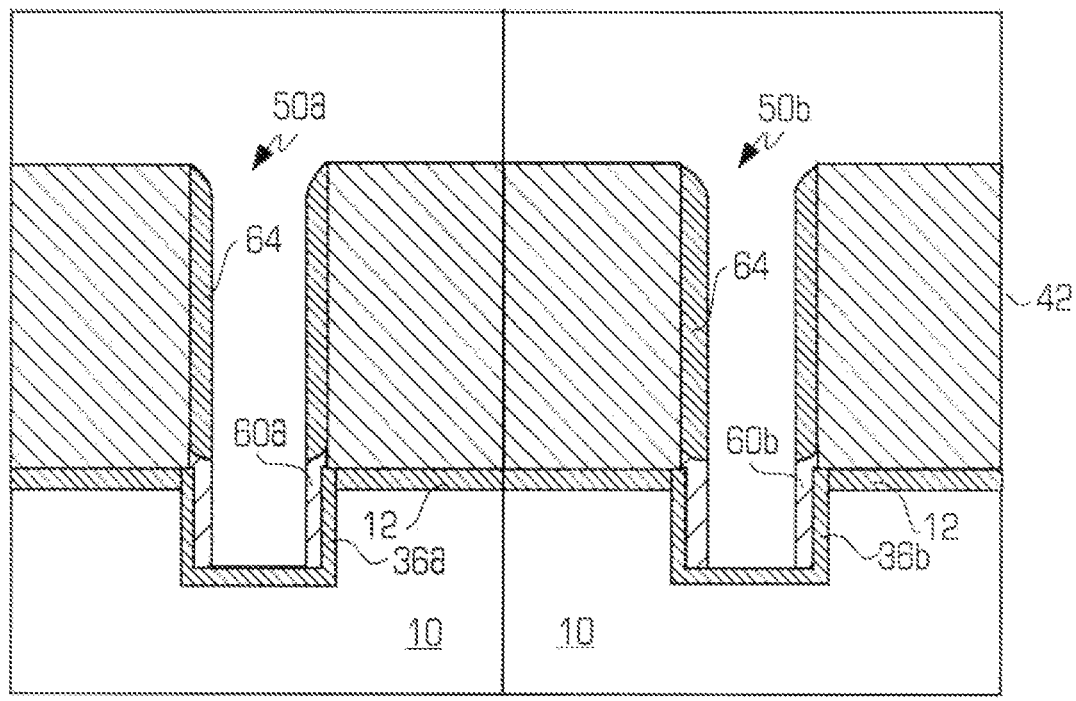

Another poly etch is then performed to create sloped portions 62 on the tops of poly block 60 (adjacent the second trench sidewalls). Oxide spacers 64 are then formed along the second trench sidewalls 50 and over the sloped portions 43 of poly blocks 60. Formation of spacer is well known in the art, and involves the deposition of a material over the contour of a structure, followed by an anisotropic etch process, whereby the material is removed from horizontal surfaces of the structure, while the material remains largely intact on vertically oriented surfaces of the structure. Spacers 64 can be formed of any dielectric material, such as oxide, nitride, etc. In the present embodiment, insulating spacers 64 are formed by depositing a layer of oxide over the entire structure, followed by a anisotropic oxide etch process, such as the well known Reactive Ion Etch (RIE), to remove the deposited oxide layer except for spacers 64. The resulting active region 40 is shown in FIG. 2D An anisotropic poly etch is next performed, which removes the center portions of the poly blocks 60 that are not protected by oxide spacers 64, leaving a pair of opposing poly blocks 60a in each of the second trenches 50, as shown in FIG. 2E.

Figure 2F:
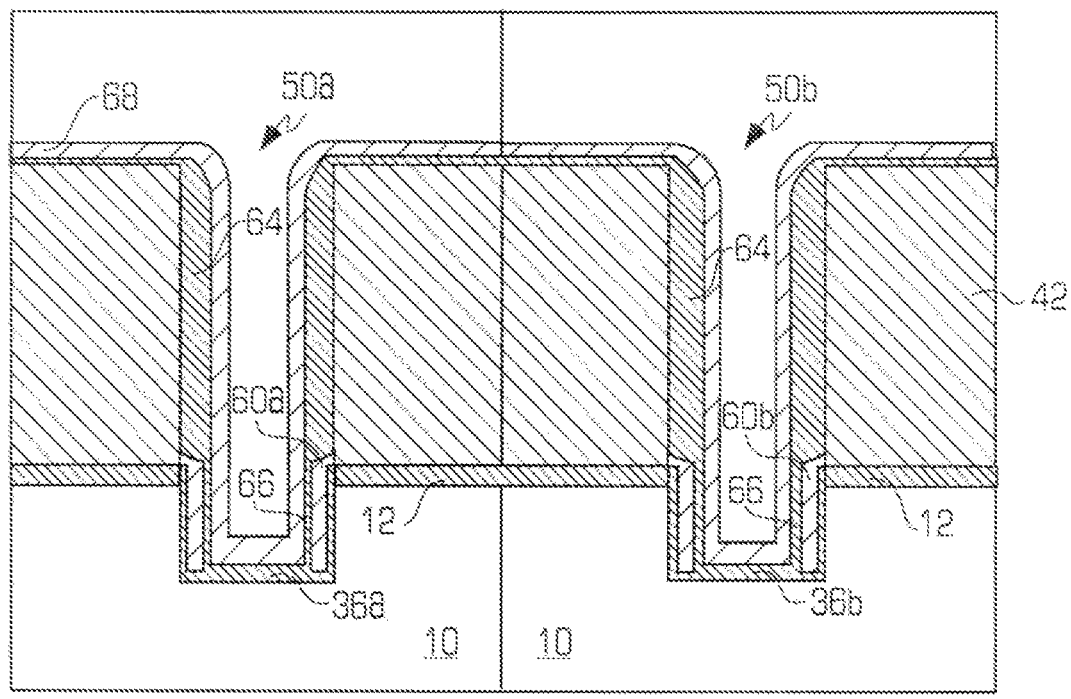

An insulation deposition (approximately 100 Å) and anisotropic etch-back process (preferably using oxide is then used to form an insulation layer 66 along the exposed sides of poly blocks 60a inside second trenches 50 (shown in FIG. 2F). The insulation material could be any insulation material (e.g. ONO—oxide/nitride/oxide, or other high dielectric materials). Preferably, the insulation material is oxide, so that the oxide deposition/etch process also thickens the oxide spacers 64. A polysilicon deposition (approximately 100 Å) and anisotropic etch-back process is then used to form layer 68 along the exposed sides of oxide 64 and inside the trenches 50. The resultant structure is shown in FIG. 2F.

Figure 2G:
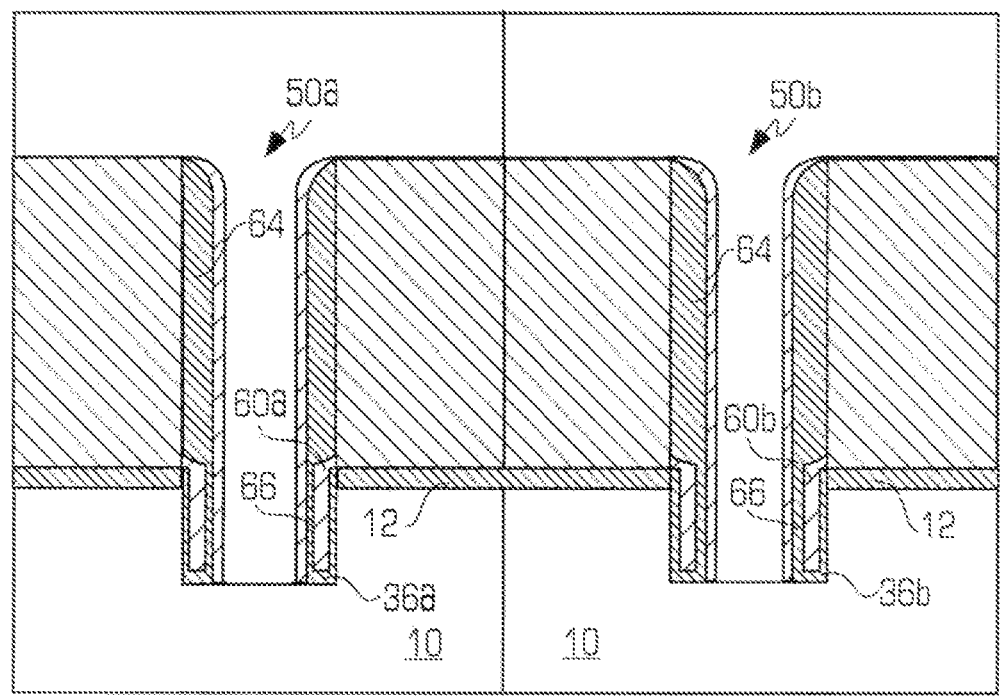
Figure 2H:
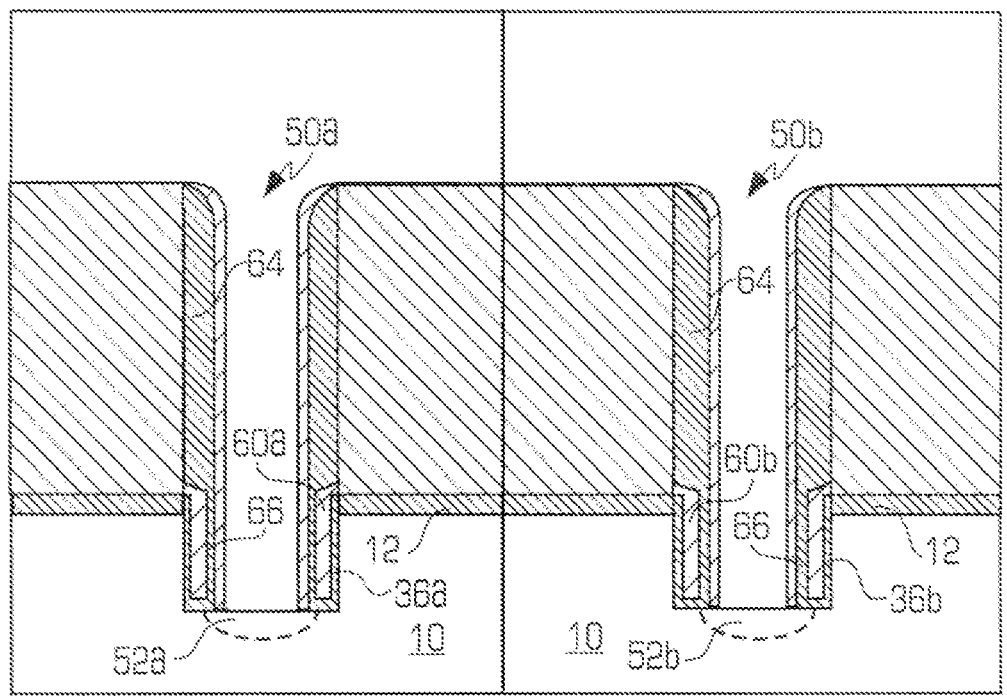

The structure shown in FIG. 2F is subject to an anisotropic etch process which removes the polysilicon 68 from the bottom wall of the trenches 50. Thereafter, an anisotropic etch of the oxide 36 from the bottom wall of the trench 50 is performed, exposing the substrate 10. The resultant structure is shown in FIG. 2G Suitable ion implantation (and possible anneal) is then made across the surface of the structure to form first (source) regions 52 in the exposed substrate portions at the bottom of second trenches 50. The source regions 52 are self-aligned to the second trenches 50, and have a second conductivity type (e.g. N type) that is different from a first conductivity type of the substrate (e.g. P type). The ions have no significant effect on the nitride layer 42. The resulting active region 40 is shown in FIG. 2H.

Figure 2I:
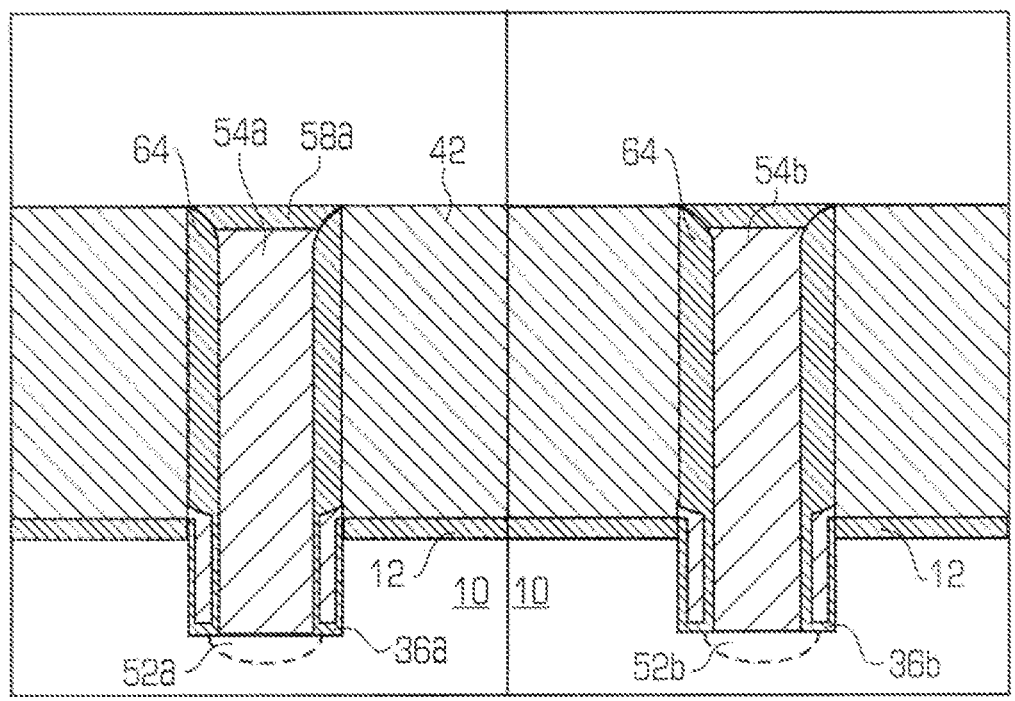
Figure 2J:
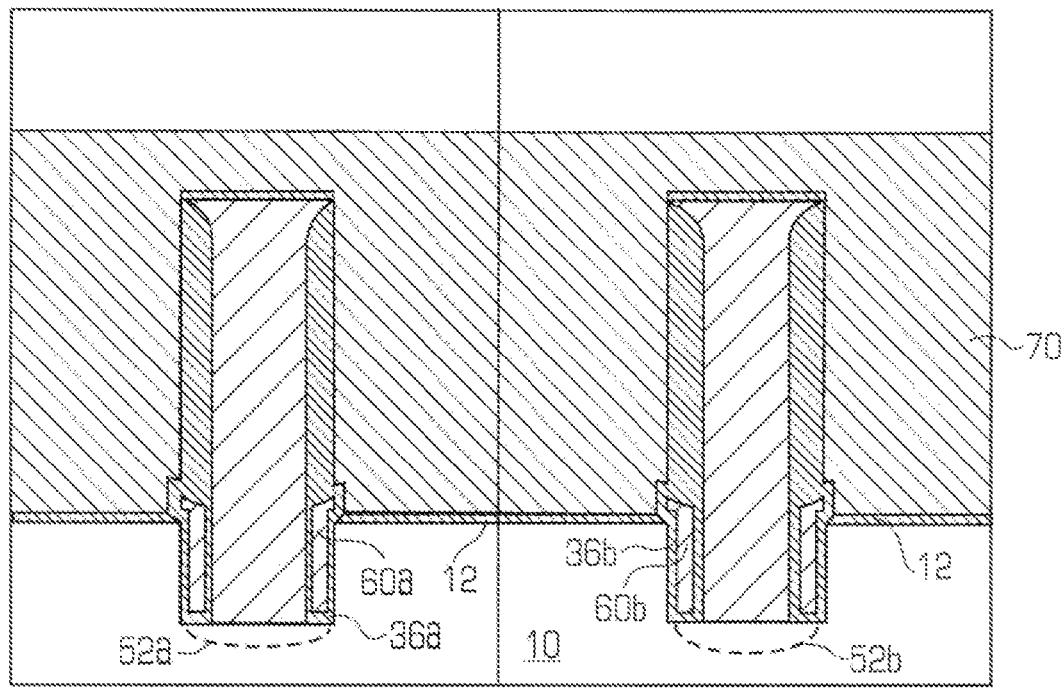

A poly deposition step, followed by a poly CMP etch (using the nitride layer 42 as an etch stop) are used to fill second trenches 50 with poly blocks 54, as shown in FIG. 2I. In situ doping of the polysilicon 54 is also performed. Thereafter, the polysilicon is etched back in the trench 40 A layer (approximately 170 Å) of oxide 58 is grown on the structure capping the polysilicon 54 in the trench 50. This is followed by CMP so that the oxide 58 is planar with respect to the nitride 42. The resultant structure is shown in FIG. 2I.

Figure 2K:
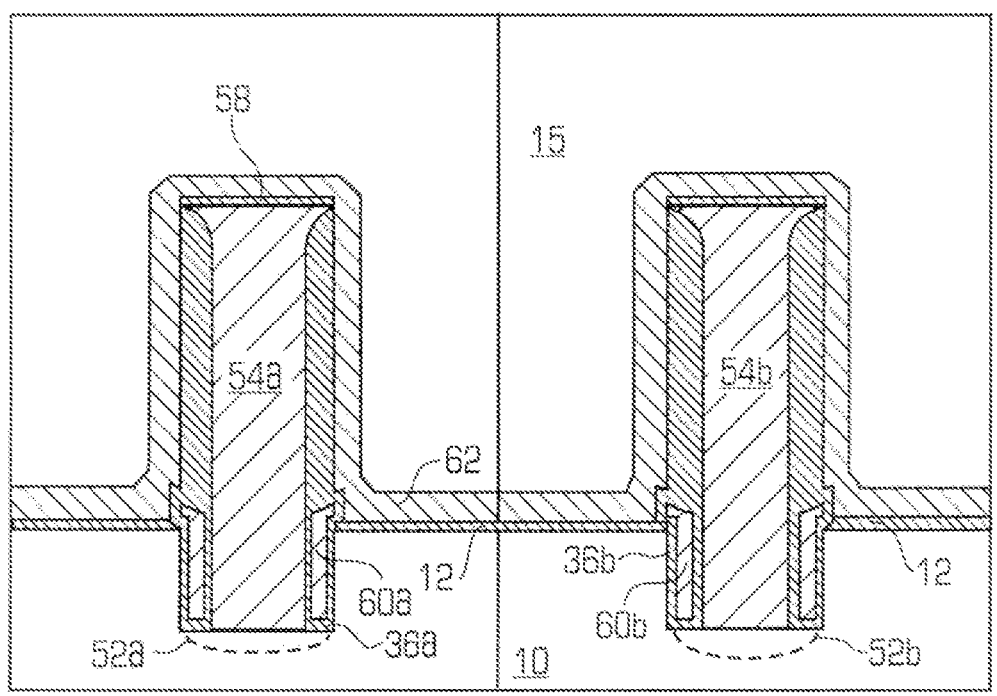
Figure 3:
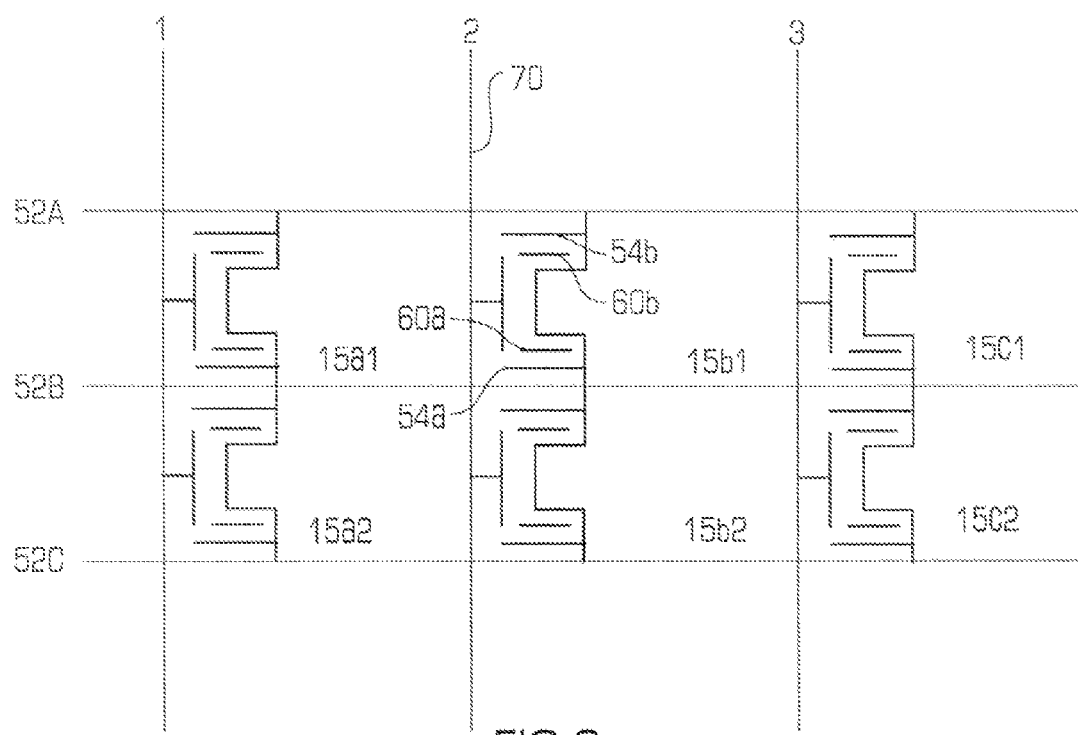
FIG. 3 is a schematic circuit diagram of the memory cell array of the present invention.

A nitride etch follows, which removes nitride layer 42. A poly deposition step is used to form a poly layer 70 over the structure (e.g. approximately 500 Å thick). Photo resist deposition and masking steps follow to form strips of poly layer 70 that are spaced apart from one another each over an active region 40. The resulting active region 40 is shown in FIG. 2K. Each poly layer 70 functions as a word line for the memory array.

As shown in FIG. 2K, the process of the present invention forms an array of memory cells, with each memory cell 15 being between a pair of spaced apart source/drain regions 52(a,b) (those skilled in the art would appreciated that the term source and drain may be interchanged during operation.) A non-planar channel region connects the two source regions 52(a,b), with the channel region having three portions; a first portion, a second portion and a third portion. The first portion of the channel region is along one of the sidewall of one of the trenches 50, and is adjacent to the first source region 52a. The second portion of the channel region is along one of the sidewall of the other trench 50, and is adjacent to the second source region 52b. A third portion of the channel region is between the first portion and the second portion and is substantially along the top surface of the substrate 10. A dielectric layer is over the channel region. Over the first portion of the channel region, the dielectric is the layer 36a. Over the second portion of the channel, the dielectric is the layer 36b. Over the third portion of the channel region, the dielectric is the layer 12. A first floating gate 60a is on the layer 36a, and is over the first portion of the channel region, which is adjacent to the first source region 52a. A second floating gate 60b is on the layer 36b, and is over the second portion of the channel region, which is adjacent to the second source region 52b. A gate electrode 70, formed by the poly layer 70, is over the dielectric layer 12 and is over the third portion of the channel region. A first control gate 54a is connected to the first source region 52a, and is capacitively coupled to the first floating gate 60a. A second control gate 54b is connected to the second source region 52b, and is capacitively coupled to the second floating gate 60b. Further, each of the floating gates 60a and 60b is substantially perpendicular to the gate electrode 70 and to the surface of the substrate 10. Finally, each source region, e.g. first source region 52a, and its associated control gate, e.g. first control gate 54a is shared with an adjacent memory cell 15 in the same active region 40.

The floating gates 60 (a,b) are disposed in trenches 50, with each floating gate facing and insulated from a portion of the channel region. Further, each floating gate 60 (a,b) includes an upper portion that extends above the substrate surface and terminates in an edge that faces and is insulated from one of the control gates 70, thus providing a path for Fowler-Nordheim tunneling through oxide layer 36. Each control gate 54 extends along and are insulated from floating gates 50, for enhanced voltage coupling therebetween.

With respect to the plurality of memory cells 15 that form an array, the interconnection is as follows. For memory cells 15 that are in the same column, i.e. in the same active region 22, the word line 70 that forms the gate electrode for each memory cell 15 is extended in the Y direction to each of the memory cells 15. For memory cells 15 that are in the same row, i.e. across the active regions 40, the source lines 52 (a,b) and/or the associated control gates 54 (a,b) are extended in the X direction to each of those memory cells 15. Because the source regions 52(a,b) are in a trench 50, they are in the active regions 40 and extend to an adjacent active region 40. Thus, the formation of the source regions 52 form a continuous connection between the memory cells 15 that are in the row direction and extend in the X direction. Of course, the subsequent formation of the associated control gates 54 (a,b) would also connect the memory cells 15 in the row direction. Finally, as can be seen from the foregoing, memory cells 15 in adjacent rows, share the same source region 52 and the same associated control gate 54.

The operation of the memory cell 15 and the array shown in FIG. 2P is identical to that shown and described in U.S. patent application Ser. No. 10/409,333 published on Oct. 7, 2004, whose disclosure is incorporated herein by reference in its entirety.

What is claimed is:

1. An array of non-volatile memory cells, arranged in a plurality of rows and columns, said array comprising:
   a substantially single crystalline semiconductive substrate material having a planar surface of a first conductivity type;
   a plurality of non-volatile memory cells arranged in a plurality of rows and columns in said semiconductive substrate material with each cell for storing a plurality of bits, and with each cell comprising:
      a first region of a second conductivity type, different from said first conductivity type in said material;
      a second region of said second conductivity type in said material, spaced apart from said first region;
      a channel region, having a first portion, a second portion and a third portion, connecting said first and second regions for the conduction of charges;
      a dielectric on said channel region;
      a first floating gate on said dielectric, spaced apart from said first portion of said channel region; said first portion of said channel region adjacent to said first region, said first floating gate for the storage of at least one of said plurality of bits and having a first end above said planar surface;
      a second floating gate on said dielectric, spaced apart from said second portion of said channel region; said second portion of said channel region adjacent to said second region, said second floating gate for the storage of at least another of said plurality of bits and having a first end above said planar surface;
      a gate electrode on said dielectric, spaced apart from said third portion of said channel region, said third portion of said channel region between said first portion and said second portion;
      a first gate electrode electrically connected to said first region and capacitively coupled to said first floating gate; and
      a second gate electrode electrically connected to said second region and capacitively coupled to said second floating gate;
      a layer of insulating material on said substrate material between the first ends of the floating gates of adjacent rows, separating the first ends of floating gates in one row from the first ends of floating gates in an adjacent row;
   wherein said cells in the same row have said gate electrode in common, and cells in adjacent rows are separated from one another by said semiconductive substrate material without any isolation material in the substrate between cells in different rows to electrically separate them;
   wherein said first region extends continuously across a plurality of rows through the semiconductive substrate material and connects to cells in the same column in common, said second region extends continuously across a plurality of rows through the semiconductive substrate material and connects to cells in the same column in common, said first gate electrode extends continuously across a plurality of rows and connects to cells in the same column in common, and said second gate electrode extends continuously across a plurality of rows and connects to cells in the same column in common; and
   wherein said cell in adjacent columns have said first region in common and said first gate electrode in common.

2. The array of claim 1 wherein said first portion of said channel region is substantially perpendicular to said planar surface.

3. The array of claim 2 wherein said second portion of said channel region is substantially perpendicular to said planar surface.

4. The array of claim 3 wherein said third portion of said channel region is substantially parallel to said planar surface.

5. The array of claim 4 wherein said silicon has a first trench with a sidewall and a bottom wall, with said first portion of said channel region along said sidewall.

6. The array of claim 5 wherein said silicon has a second trench with a sidewall and a bottom wall, with said second portion of said channel region along said sidewall.

7. The array of claim 6 wherein said first floating gate is in said first trench spaced apart from said sidewall of said first trench; said first floating gate having a tip portion substantially perpendicular to said gate electrode.

8. The array of claim 6 wherein said second floating gate is in said second trench spaced apart from said sidewall of said second trench; said second floating gate having a tip portion substantially perpendicular to said gate electrode.

9. The array of claim 8 wherein said first region is along said bottom wall of said first trench.

10. The array of claim 9 wherein said second region is along said bottom wall of said second trench.

11. The array of claim 10 wherein said first gate electrode is in said first trench, spaced apart from said first floating gate and electrically connected to said first region.

12. The array of claim 11 wherein said second gate electrode is in said second trench, spaced apart from said second floating gate and electrically connected to said second region.

13. A method of manufacturing an array of non-volatile memory cells in a substantially single crystalline semiconductive substrate of a first conductivity type, wherein said array of non-volatile memory cells has a plurality of non-volatile memory cells arranged in a plurality of rows and columns in said semiconductive substrate with each cell for storing a plurality of bits, said substrate having a substantially planar surface, said method comprising:
   forming spaced apart isolation regions on said planar surface of said semiconductive substrate that are substantially parallel to one another and extend in a said column direction, with the semiconductive substrate beneath each isolation region with an active region between each pair of adjacent isolation regions,
   forming a plurality of memory cells in each of the active regions, wherein each memory cell for the storage of a plurality of bits, wherein the formation of each of the memory cells includes:
      forming a first and a second spaced apart trenches into the planar surface of the substrate, each of said first and second trenches having a sidewall and a bottom wall;
      forming a first region and a second region in said bottom wall of said first and second trenches, respectively, with said first region and said second region being of a second conductivity type, different from said first conductivity type, with a channel region for the conduction of charges connecting said first region and said second region; said channel region, having a first portion, a second portion and a third portion with each of said first and second regions extending continuously in said column direction across a plurality of rows, through the semiconductive substrate;

forming a dielectric on said channel region;

forming a first floating gate on said dielectric, in said first trench spaced apart from said sidewall of said first trench and from said first portion of said channel region; said first portion of said channel region adjacent to said first region, said first floating gate for the storage of at least one of said plurality of bits and having a first end above the planar surface;

forming a second floating gate on said dielectric, in said second trench spaced apart from said sidewall of said second trench and from said second portion of said channel region; said second portion of said channel region adjacent to said second region, said second floating gate for the storage of at least another of said plurality of bits and having a first end above the planar surface, wherein said first ends of first and second floating gates of cells in one row are separated from first ends of first and second floating gates of cells in an adjacent row by said isolation region and wherein cells in different rows are electrically separated from one another by the semiconductor substrate without any isolation material in the substrate;

forming a gate electrode on said dielectric, spaced apart from said third portion of said channel region, said third portion of said channel region between said first portion and said second portion;

forming a first gate electrode in said first trench, said first gate electrode electrically connected to said first region and capacitively coupled to said first floating gate said first gate electrode extending continuously in said column direction across a plurality of rows; and forming a second gate electrode in said second trench, said second gate electrode electrically connected to said second region and capacitively coupled to said second floating gate, said second gate electrode extending continuously in said column direction across a plurality of rows.

* * * * *